United States Patent [19]

Cabaud

[11] 4,015,322
[45] Apr. 5, 1977

[54] APPARATUS FOR LOCATING CONNECTORS ONTO A CIRCUIT BOARD

[75] Inventor: Aimé Cabaud, Versailles, France

[73] Assignee: Comatel - Comptoir European de Materiel Electronique, Issy-Les-Moulineaux, France

[22] Filed: June 3, 1976

[21] Appl. No.: 692,483

[52] U.S. Cl. ............................ 29/739; 29/564.8; 29/235; 29/626; 29/628
[51] Int. Cl.² ................................. H01K 43/00
[58] Field of Search .......... 29/203 B, 203 P, 203 S, 29/203 R, 203 HL, 235, 626, 628

[56] References Cited
UNITED STATES PATENTS 3,293,735 12/1966 Lovendusky ................. 29/203 B
3,769,679 11/1973 Kendall ....................... 29/203 B

*Primary Examiner*—Carl E. Hall
*Attorney, Agent, or Firm*—Amster & Rothstein

[57] ABSTRACT

Apparatus for locating connectors onto a circuit board comprises a feed device for feeding stepwise a continuous strip of connectors. Each connector has a clamp at one end and the feed device feeds the strip through successive stations in which the clamps are set to the thickness of the board, the edge of the board is inserted into the clamps of a group of connectors, the group of connectors is separated from the remainder of the strip, and the circuit board with the connectors located thereon is discharged from the apparatus.

15 Claims, 19 Drawing Figures

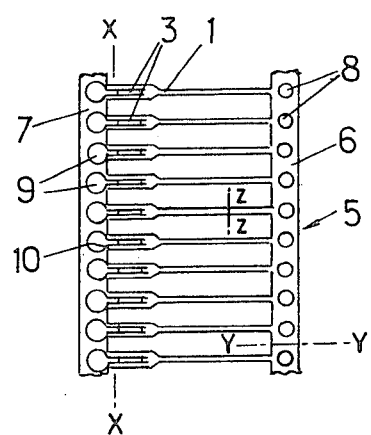
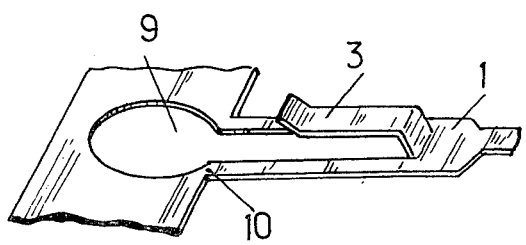
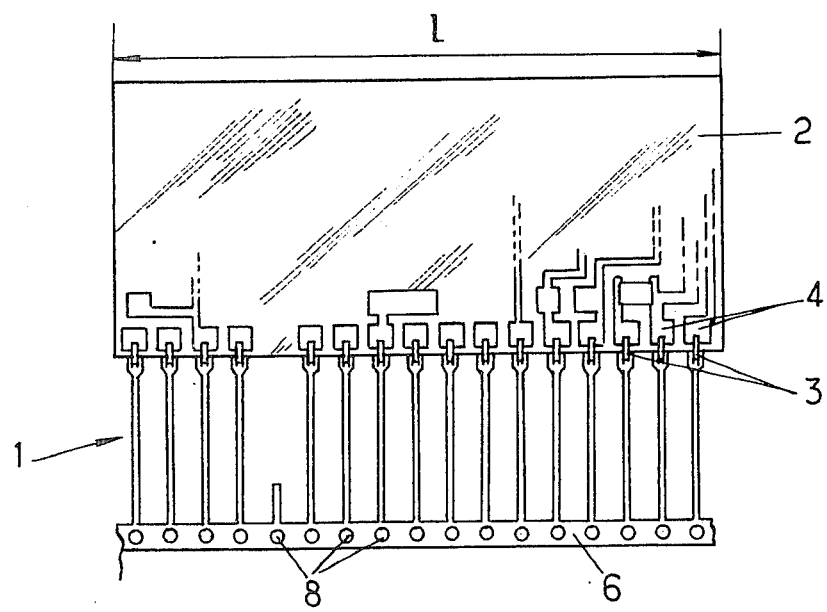

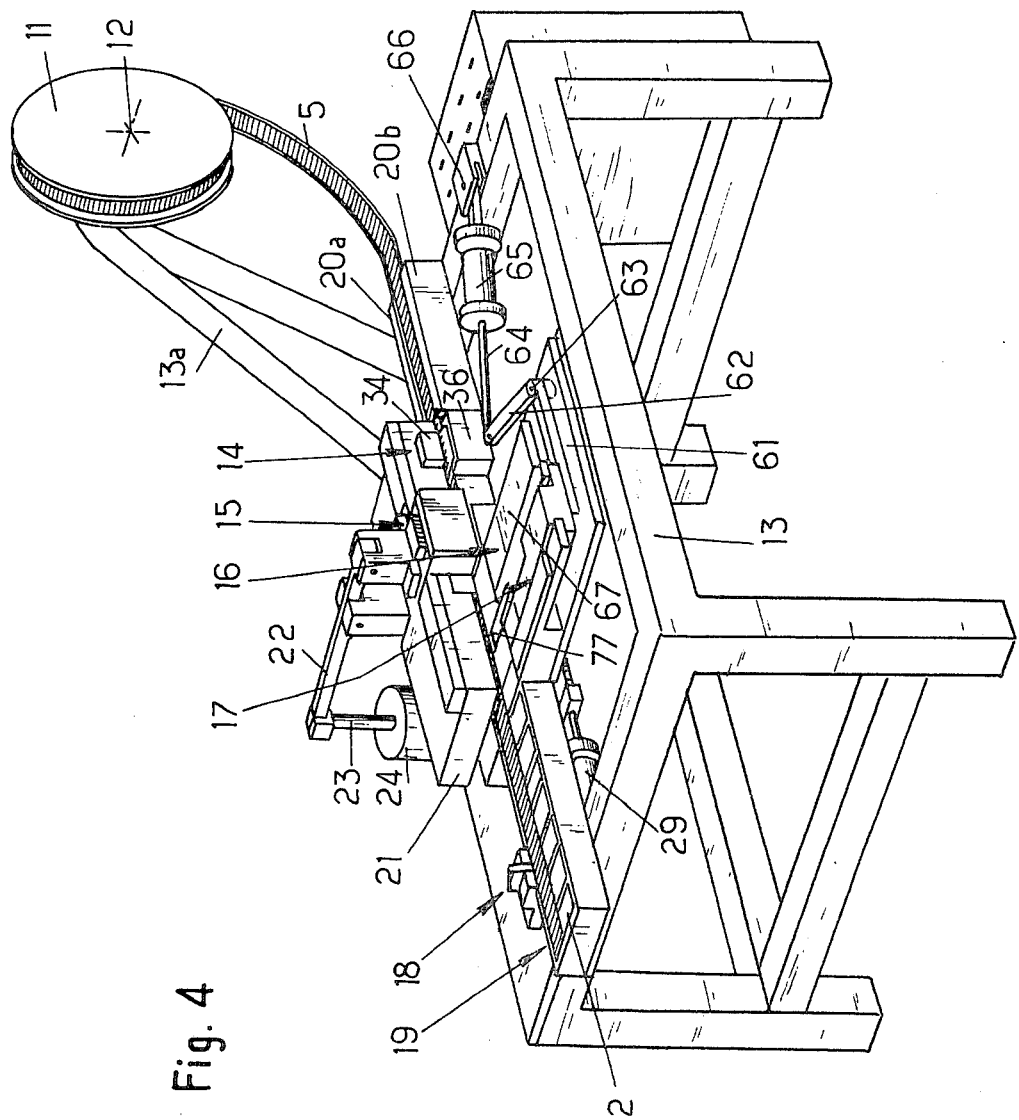

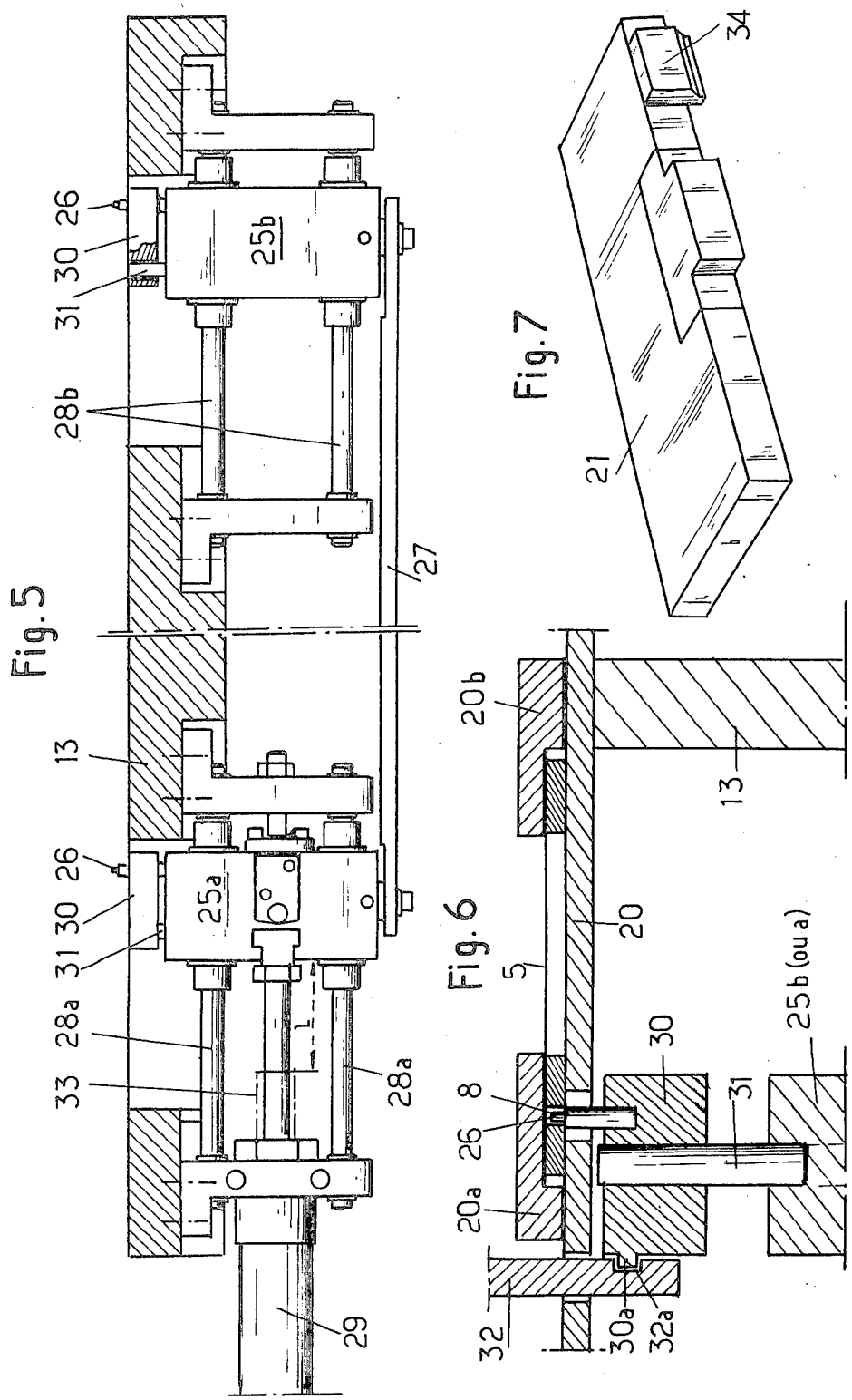

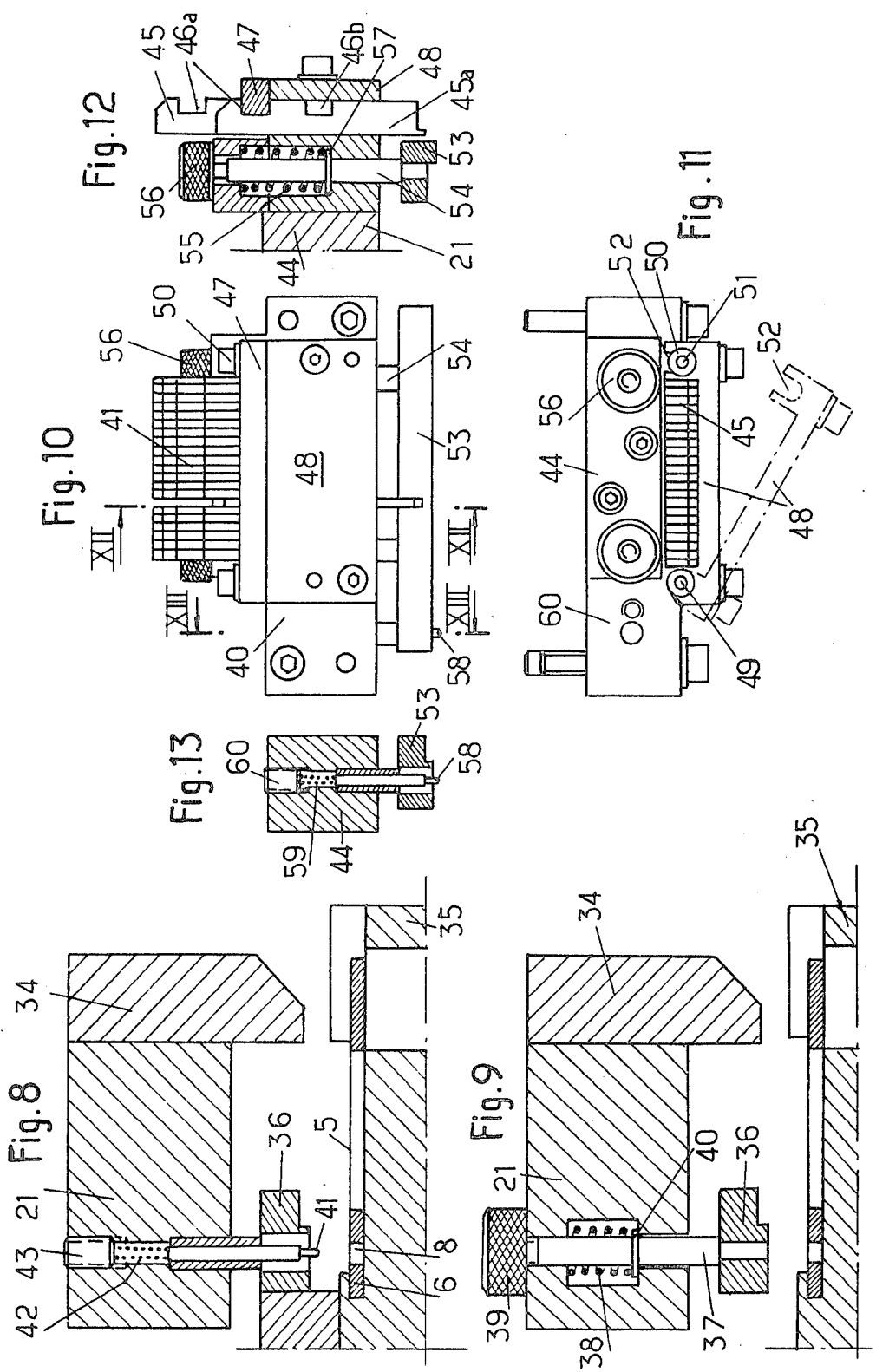

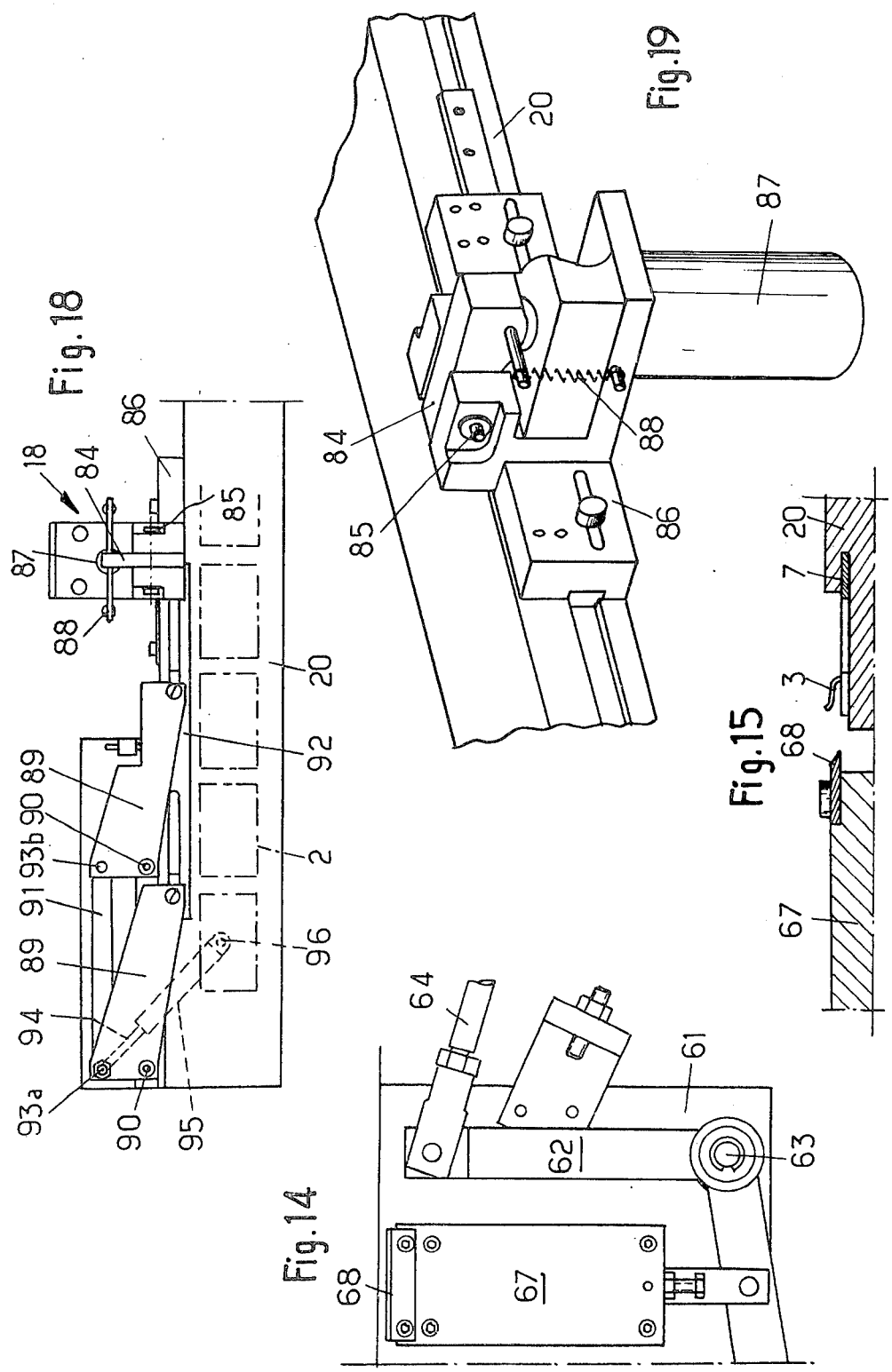

APPARATUS FOR LOCATING CONNECTORS ONTO A CIRCUIT BOARD

BACKGROUND OF THE INVENTION

1. Field of the Invention

The present invention relates to apparatus for locating connectors onto a circuit board.

2. Description of the Prior Art

There have been proposed connectors which are intended to be soldered onto circuit boards, for example printed circuits on which are formed components such as resistors or capacitors. These connectors have at one of their ends a clamp into which an edge of the circuit board is inserted, this clamp being subsequently soldered to the circuit board; the other end of the connector can be inserted into a printed circuit, or can be soldered to a conductor.

The connectors are initially connected in the form of a continuous strip, and are cut out from the strip and are then positioned, manually, one by one on the circuit board.

An object of the present invention is to provide apparatus which automatically positions the connectors on the circuit board.

SUMMARY OF THE INVENTION

According to the invention, there is provided apparatus for locating connectors onto a circuit board, said connectors each having first and second opposed end portions, each of said first end portions being intended for insertion into a printed circuit or for soldered connection to a conductor and each of said second end portions comprising a clamp, said connectors being arranged in a strip by first connecting means interconnecting the connectors at their first end portions, and second connecting means interconnecting the connectors adjacent their second end portions, said apparatus comprising a frame, a reel for said strip of connectors, support means for supporting the said reel from the frame, means defining a guide path for the strip unwound from the reel, means for indexing the strip stepwise along the guide path, first cutting means for cutting a portion of the strip longitudinally adjacent the clamps whereby to separate the adjacent connectors from the second connecting means, means for gauging the clamps of the connectors of a portion of the strip, means for inserting a circuit board into the connectors of the strip, second cutting means for cutting the first connecting means transversely, and means for discharging from the apparatus circuit boards provided with said connectors.

BRIEF DESCRIPTION OF THE DRAWINGS

An embodiment of the invention, will now be described by way of example only, with reference to the accompanying diagrammatic drawings, in which:

FIG. 1 is a plan view of a connector strip;

FIG. 2 is a perspective view of a detail of the strip on a larger scale;

FIG. 3 shows in plan view connectors positioned on a circuit board by apparatus according to the invention;

FIG. 4 is a perspective view of apparatus according to the invention;

FIG. 5 is a horizontal section showing means for advancing the strip through the apparatus;

FIG. 6 is a vertical section of the strip-advancing means, on a larger scale;

FIG. 7 is a perspective view of a tool-bearer block of the apparatus;

FIG. 8 is a cross section of the tool-bearer block;

FIG. 9 is a cross section of the tool-bearer block through a plane parallel with that of FIG. 8;

FIG. 10 is an elevation of a blade assembly of the apparatus;

FIG. 11 is a plan view of the blade assembly;

FIG. 12 is a section taken on line XII-XII of FIG. 10;

FIG. 13 is a section taken on line XIII-XIII of FIG. 10;

FIG. 14 is a plane view of a gauging shim of the apparatus;

FIG. 15 is a cross section of the gauging shim apparatus;

FIG. 18 is a plan view showing means for cutting part of the connector strip transversely and for discharging the circuit boards from the apparatus; and FIG. 19 is a rear perspective view corresponding to FIG. 18.

DESCRIPTION OF THE PREFERRED EMBODIMENTS

Figure 16:
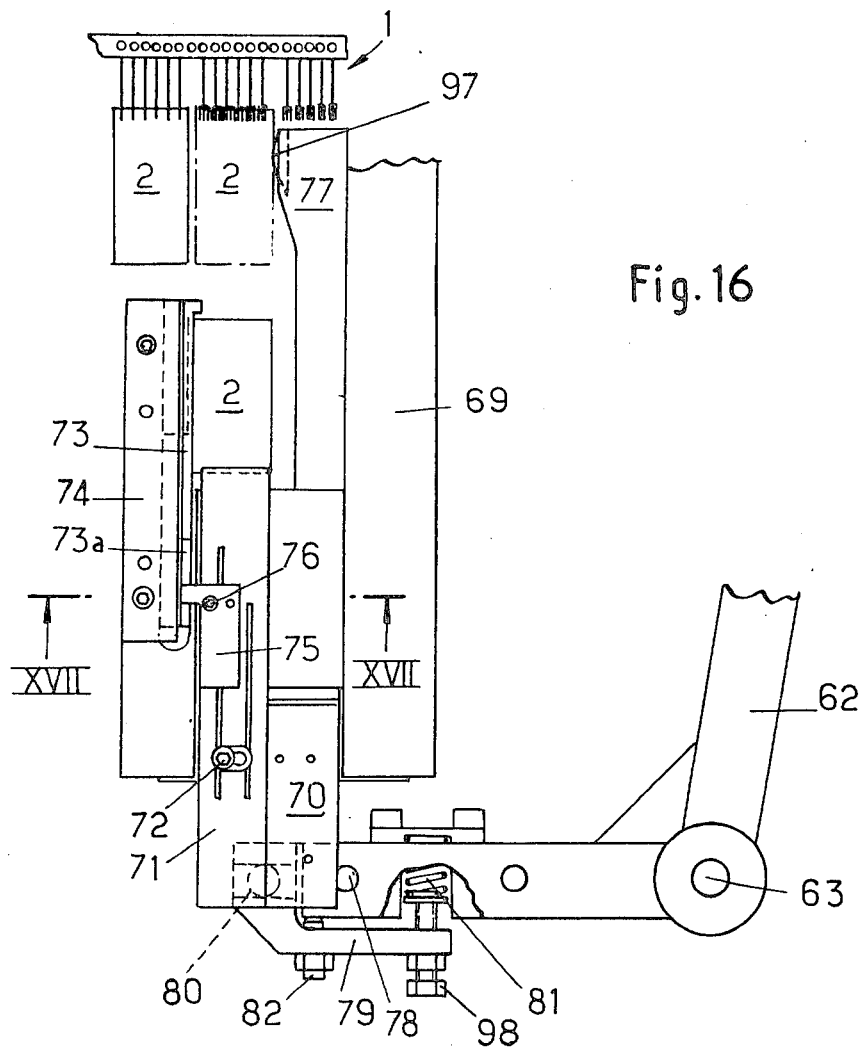
FIG. 16 is an elevation showing means for inserting circuit boards into the connectors of the strip.

The apparatus in accordance with the invention is intended for the positioning of connectors 1 on a printed circuit or other circuit board 2. These connectors have, at one of their ends, a clamp 3 which engages around the edge portion of the circuit board 2 adjacent a connection area 4; the other ends of the connectors 1 are intended to be inserted into a printed circuit or to be soldered to a conductor. The connectors 1 are arranged initially in the form of a continuous strip 5 in which they are disposed side by side with their ends joined together by means of two parallel bands 6 and 7. Holes 8 and 9 are provided in the bands 6 and 7, along the longitudinal direction of the strip 5; the holes 9 form in the band 7 areas of weakness 10.

The strip 5 is unwound from a reel 11 which is pivotally mounted at 12 on an arm 13a rigid with the frame 13 of the apparatus. The latter comprises means for effecting the forward movement of the strip 5, in steps of a specific length 1, equal to the width of the circuit board 2, successively in front of a station 14 in which the band 7 is cut along line X—X which passes in the proximity of the areas of weakness 10, a station 15 in which one or more connectors 1, which are not required, are cut from the strip along line Z—Z, a station 16 in which the dimensions of the clamp 3 are gauged, a station 17 in which the boards 2 are inserted onto the connectors 1, a station 18 in which the band 6 is cut along line Y—Y in such a manner as to separate the individual circuit boards 2 and their connectors 1, and finally a station 19 for discharging the circuit boards. Reference 20 denotes a guide path for the strip 5, as it moves in front of the various stations, the path 20 including lateral holding strips 20a and 20b; the strip 20a extends throughout the length of the apparatus whereas the strip 20b stops at the station 14.

A tool-bearer block 21 is mounted so as to be movable vertically relative to the frame 13. This block is connected by means of an articulated tie-rod 22 with the piston rod 23 of a double-acting jack 24.

To effect the movement of the strip 5, provision is made for two blocks 25a and 25b which each carry a drive pin 26 adapted to engage into one of the holes 8 of the strip 5 (FIGS. 5 and 6). These blocks are connected together by means of an arm 27 and are able to slide on fixed guide rods 28a and 28b respectively. A double-acting jack 29 connects the block 25a to the frame 13 and permits the simultaneous displacement of the assembly of the two blocks 25a and 25b. Each of the drive pins 26 is carried by a plate 30 which is able to slide vertically on rods 31 carried by the block 25a or 25b. A plate 32 fixed to the tool-bearer block has a horizontal groove 32a in which a finger 30a of each of the plates 30 is engaged; this plate has a height such that, when the block 21 is in its upper position, it holds the plates 30 in a position in which the fingers 26 are engaged in the holes 8, these fingers coming down subsequently at the same time as block 21 to come below the path of the strip 5. An abutment 33 is fixed, in a movable manner, to the frame 13 and limits the displacement of the blocks to a distance equal to 1.

To index the strip 5 forwardly, fluid is admitted into the jack 29 in such a manner as to move the blocks 25a and 25b leftwards in FIG. 5, the tool-bearer block 21 being in its upper position; the fingers 26 thus move the strip 5 and effect its displacement by a distance 1. Then the tool-bearer block is lowered, fluid being admitted into the jack 24 in such a manner that the plates 30 come down, moving along with them the fingers 26 which come out of the strip. Then fluid is admitted into the jack 29 in such a manner as to return it to its starting position. When the tool-bearer block rises again, the fingers 26 will again engage into the holes 8 and further forwards movement of the strip 5 can take place.

A cutter punch 34 is fixed to the tool-bearer block 21, in line with the shearing station 14 (FIGS. 7 to 9) and cooperates with a matrix or die 35 fixed to the frame 13. A clamp 36 is carried by rods 37 which are movable vertically in the tool-bearer block 21, against the action of springs 38. A knurled knob 39 is screwed on the threaded end of each of the rods 37 and a washer 40, engaged in a groove in each rod, prevents the rod from coming out of the block 21 under the action of the spring 38 and permits the adjustment of the pressure exerted on the strip 5 by the clamp 36. Moreover, pins 41, able to engage in the holes 8 of the strip 5, are slidably mounted in the block 21 against the action of a spring 42 held by an abutment screw 43; a washer acting as an abutment for the spring 42 and engaged in a groove of the pin prevents the latter from coming out of the block under the action of the spring 42. When the block 21 descends, the pin 41 engages into a hole 8, and prevents the strip 5 from moving longitudinally. Then the clamp is applied on the band 6 of the strip 5 at the same time as the punch 34 cuts the strip 5 along line X—X (see FIG. 1).

In line with the station 15, the tool-carrier block 21 carries a support 44 in which cutting blades 45 are mounted (FIGS. 10 to 13); the distance between the latter is the same as that between the connectors 1 in the strip 5. These blades 45 have two vertically spaced notches 46a and 46b into one of which a small bar 47 can engage. The latter is carried by a small plate 48 which is pivotally mounted at 49 on the support 44. The plate 48 can be immobilised by tightening a nut 50 which is screwed on a threaded rod 51 passing through a slit 52 in the plate 48.

A clamp 53 is carried by rods 54 which are movable vertically in the support 44 against the action of springs 55. A knurled knob 56 is screwed on the threaded end of each of the rods 54 and a washer 57 prevents the rod from coming out of the support and permits the regulation of the pressure exerted on the strip 5 by the clamp 53.

A pin 58, adapted to engage into a hole 8 of the strip 5, is slidably mounted in the support 44 against the action of a spring 59 held by an abutment screw 60.

Before using the apparatus, one or more of the blades 45 (for example blade 45a) is placed in a lower position, in order to cut from predetermined positions in the strip 5, connectors 1 which are not required for the circuit boards 2 in question; then, the plate 48 is closed again, and immobilised by tightening the nut 50.

When the tool-carrier block 21 comes down, the pin 58 comes first of all into engagement in a hole 8 of the strip 5, in such a manner as to immobilise the strip longitudinally. Then the clamp 53 is applied resiliently against the band 6 of the strip 5 and the blade 45a cuts a selected connector 1 along Z—Z (FIG. 1) so that this connector can be removed.

On the frame 13 a plate 61 is fixed on which a cranked lever 62 is pivotally mounted at 63 (FIG. 14 and 15). The end of one of the limbs of this lever is pivoted to the rod 64 of a jack 65 which is itself pivoted at 66 on the frame 13. On the other limb of the lever 62 there is fixed a support 67 for a gauging shim 68 of a width at least equal to the thickness of the board 2.

When the jack 65 is brought to a retracted position, the lever 62 swivels and the gauging shim 68 enters the clamps 3 of the connectors 1 which are in front of it, giving to these clamps the desired opening.

A slide 69 (FIGS. 16 and 17) is fixed on the plate 61, in line with the station 17. In this slide there is slidably mounted a drawer 70 on which a pusher 71 is fixed by means of screws 72. A lateral guide 73 is slidably mounted on the plate 61 being held by a small plate 74 fixed on the slide 69. The drawer 70 carries a forward-movement finger 75 fixed in adjustable manner by means of a screw 76 and engaged into a keyway 73a of the guide 73. A guide 77 is fixed on the slide 69 in an extension of the drawer 70 and has at its end a spring 97 which urges the circuit board being inserted against the guide 73.

Figure 17:
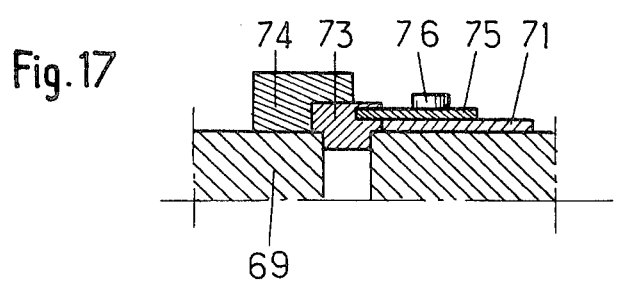
FIG. 17 is a section taken on line XVII—XVII of FIG. 16.

On the end of the second limb of the cranked lever 62, an angled plate 79 is pivotably mounted at 78; it carries a pin 80 engaged in a hole of the drawer 70. A compensating spring 81, which can be adjusted by means of a screw 98, acts to pivot the plate 79 as shown in FIG. 16, and an adjustable stop screw 82 limits this pivoting movement thus permitting adjustment of the initial position of the pin 80.

To insert a circuit board 2, the board is placed on the plate 61 in front of the pusher 71 and the jack 65 is brought to its retracted position. The lever 62, as it swivels, pushes back the drawer 70 with a force limited by the calibration of the spring 81, which prevents damage to parts of the apparatus in the event of an over-dimensioned circuit board or of a handling error. The pusher 71 moves the circuit board 2 on the plate 61 towards the strip 5; the finger 75 moves towards the strip 5, entraining the guide 73. The circuit board 2 is thus guided by the guides 73 and 77 in such a manner as to be first of all orientated perpendicularly to the strip 5, and then moved towards the strip 5 until its edge engages in the clamps 3 of the connectors 1.

When the jack returns to the starting position, the drawer 70 returns to its initial position; at the same time, the finger 75 brings the lateral guide 73 back to its initial position, in such a manner that the latter cannot hinder the movement of the strip 5 during subsequent movement of the strip 5.

As a result of a suitable selection of the width of the pusher 71, of the position of the pusher on the drawer 70, and of the position of the finger 75 on the pusher, it is possible to adapt the apparatus to the dimensions of circuit board 2.

At station 18 provision is made for a cutter 84 which is pivotally mounted about a shaft 85 on a support 86 fixed in adjustable manner on the guide path 20 of the strip 5 (FIGS. 18 and 19); this cutter is adapted to cut the band 6 along a line Y—Y (FIG. 1) and is controlled by a jack 87. Springs 88 connect the support 86 with the cutter 84 and act to hold the latter against an abutment (not shown) in a position in which the cutter 84 is spaced from the strip 5. The operation of the jack 87 thus effects the separation of individual circuit boards 2 or groups of circuit boards 2. A counter device permits either cutting off each circuit board 2 simultaneously, or cutting off per group of a predetermined number, or disengaging the cutting system to obtain a continuous strip of circuit boards which remain connected by the uncut band 6.

Facing the end of the guide path 20, there are two ejectors 89 which are pivotally mounted at 90 relative to the fixed frame and are joined together by small rods 91 and 92 pivoted about the ejectors respectively at 93a and 93b. The pivot 93a is carried by a piston rod 94 of a double acting jack 95 pivotally mounted at 96 under the guide path 20. The operation of the jack 95 thus causes the swivelling of the ejectors 89 which discharge the circuit board or group of circuit boards 2 outside the guide path 20.

The operation of the apparatus is clear from the foregoing. The following operations are successively performed:

A circuit board 2 is placed on the plate 69 and the jack 65 is operated to advance the drawer 70 forwardly. The circuit board is thus pushed towards the strip 5 and its edge provided with the contact areas 4 is inserted into the clamps 3 of a series of connectors 1. At the same time, the gauging shim 68 is inserted between the clamps 3 of the set of connectors immediately upstream of that which engages the edge of the circuit board 2.

the jack 65 is brought to its initial position;

the jack 24 is operated in such a manner that the punch 34 cuts the strip 5 along X—X; at the same time the cutter or cutters 45a remove one or more connectors 1 from the strip 5;

the jack 29 is operated in such a manner as to bring it into its extended position;

the jack 24 is returned to its initial position;

the jack 87 is operated so as to separate from the strip 5, a series of connectors 1 already positioned on a circuit board 2. If it is desired to obtain a group of $n$ circuit boards 2 joined together, this jack is operated for only one cycle out of $n$ cycles;

the jack 87 is set to bleed, in such a manner that the springs 88 return the cutter 84 to its initial position;

if the jack 87 is actuated, the jack 95 is actuated in such a manner as to cause the pivoting of the ejectors 89 and the discharge from the guide path 20, of the circuit board or groups of circuit boards;

the jack 95 is returned to its initial position;

finally, the jack 29 is returned to its initial position, so that the fingers 26 engaged in holes 8 of the strip 5 index the strip forwardly by a distance equal to the width of the circuit boards 2.

The operation of the various jacks in the required order can be effected by a pneumatic logic circuit which is actuated by a single push button.

What is claimed is:

1. Apparatus for locating connectors onto a circuit board, said connectors each having first and second opposed end portions, each of said first end portions being intended for insertion into a printed circuit or for soldered connection to a conductor, and each of said second end portions comprising a clamp said connectors being arranged in a strip by first connecting means interconnecting the connectors at their first end portions, and second connecting means interconnecting the connectors adjacent their second end portions, said apparatus comprising a frame, a reel for said strip of connectors, support means for supporting the said reel an the frame, means defining a guide path for the strip as it is unwound from the reel, means for indexing the strip stepwise along the guide path, first cutting means for cutting a portion of the strip longitudinally adjacent the clamps whereby to separate the adjacent connectors from the second connecting means, means for gauging the clamps of the connectors of a portion of the strip, means for inserting a circuit board into the gauged clamps of the connectors of the strip, second cutting means for cutting the first connecting means transversely, and means for discharging from the apparatus circuit boards provided with said connectors.

2. Apparatus according to claim 1, further comprising third cutting means for cutting connectors from selected positions along the strip to remove selected connectors from the strip.

3. Apparatus according to claim 1, further comprising block means mounted for vertical movement relative to the frame, the block means carrying said cutting means, and fluid actuated means for moving the block means.

4. Apparatus according to claim 1, wherein the indexing means comprises at least one support slidable relative to the frame parallel with the guide path, fluid-actuated means for moving the support, pin means carried by the support and movable vertically relative to the support to engage into one of a series of holes formed in the strip, and means for moving the pin means vertically relative to the support.

5. Apparatus according to claim 4, further comprising block means mounted for movement relative to the frame, the block means carrying said cutting means, and fluid actuated means for moving the block means, the block means having means defining a groove parallel with the guide path, and the support comprising a finger engaged in the groove.

6. Apparatus according to claim 3, further comprising holding means movable vertically relative to the block means, and spring means biasing the holding means, the holding means engaging resiliently into one of a series of holes formed longitudinally in the strip, when the block means is in a lower position.

7. Apparatus according to claim 3, further comprising at least one clamp movable vertically relative to the block means and operative to press resiliently the second connecting means onto the guide path.

8. Apparatus according to claim 3, wherein the first cutting means comprises a cutting punch, said apparatus further comprising die means fixed on the frame, the punch cooperating with the die means.

9. Apparatus according to claim 2, further comprising block means mounted for vertical movement relative to the frame, the block means carrying said first, second, and third cutting means, and fluid-actuated means for moving the block means, the third cutting means comprising an assembly of cutting blades fixed to the block means to occupy a selected one of two different vertical positions relative to the block means.

10. Apparatus according to claim 9, wherein each of said blades has two vertically-spaced notches, said apparatus further comprising support means rigid with the block means, and bar means carried by the support means and engaged in a selected one of the notches whereby to retain the blade on the support means in a selected vertical position.

11. Apparatus according to claim 1, wherein the means for gauging the clamps comprises a gauging shim engageable in the clamps, support means carrying the shim, and fluid-actuated means for moving the support means so that the shim enters the clamps.

12. Apparatus according to claim 1, wherein the means for inserting a circuit board into the connectors comprises pusher means movable relative to the frame in a direction perpendicular to the guide path, a lateral guiding member for the circuit board, said guiding member being movable through a limited distance relative to the pusher means and being located downstream relative to the pusher means, a fixed lateral guide member downstream of the pusher means, and fluid-actuated means for moving the pusher means.

13. Apparatus according to claim 12, further comprising connection means connecting the pusher means to the fluid-actuated means, said connection means comprising means for limiting the force in the forwards direction of the pusher means.

14. Apparatus according to claim 1, wherein the second cutting means comprises a cutting element, support means for the cutting element, the support means being fixed in an adjustable manner on the guide path, and the cutter element being movably mounted on the support means, and fluid-actuated means for moving the cutter element.

15. Apparatus according to claim 1, wherein the means for discharging from the apparatus the circuit boards provided with said connectors comprises at least one ejection member pivotably mounted relative to the frame of the machine, and fluid-actuated means for pivoting the ejection member.

* * * * *